United States Patent [19]

Bezar

[11] 3,757,406

[45] Sept. 11, 1973

[54] TOOL FOR REMOVING AND INSERTING MODULES

[75] Inventor: William Bezar, Philadelphia, Pa.

[73] Assignee: Techni-Tool, Inc., Philadelphia, Pa.

[22] Filed: July 24, 1972

[21] Appl. No.: 274,564

[52] U.S. Cl. ................ 29/203 H, 29/206, 81/5.1 R, 81/419

[51] Int. Cl. ....... H01r 43/00, B25b 7/00, B25b 7/02

[58] Field of Search .................. 29/203 H, 203 HM, 29/206; 81/5.1 R, 419

[56] References Cited

UNITED STATES PATENTS 3,602,971 9/1971 Halstead .......................... 29/203 H

*Primary Examiner*—Thomas H. Eager
*Attorney*—Allan Ratner

[57] ABSTRACT

A tool for removing and inserting modules comprising a pair of opposing jaws having a recess in which the module is clampingly held. The jaws each have a plurality of aligned teeth forming slots which communicate with the recess. The teeth are spaced so that they fit into spaces between the leads of the module. The tool includes an insertion assembly having a driving section and a component engaging section. The engaging section is disposed between the jaws and on the side of the module opposite the teeth. When the driving section is depressed, the engaging section forces the module against the teeth thereby opening the jaws and inserting the module into a circuit board or multiple contact block.

6 Claims, 5 Drawing Figures

TOOL FOR REMOVING AND INSERTING MODULES

BACKGROUND OF THE INVENTION

1. Field of the Art

This invention relates to module handling tools.

2. Prior Art

Integrated circuit or dual in-line modules have become well known and provide a number of electronic circuits within a very small package. Typical modules may have fourteen, sixteen or more leads with half the leads extending from one side and half from the other. The leads may be flat metal strips, round wires or variations thereof. In many applications, modules may be mounted very close to each other and may be very hard to reach. The small size of the module together with close spacing and the easily deformable leads makes handling of the modules quite difficult.

U.S. Pat. No. 3,602,971 assigned to the same assignee as the present invention, shows a tool for removing and inserting such modules into socket holes in printed circuit boards or into multiple connector blocks (headers). This tool is plier-like with opposing jaws with clampingly hold the module body while the leads of the module project outwardly through slots in the jaws of the tool. The foregoing tool is particularly useful in hard to reach locations and is effective to remove a module from a circuit board or header without bending or misaligning the leads. In inserting the module, the jaws of the tool hold the module with the leads properly indexed while the operator pushes or rocks the module into place. However, there is no provision for an assembly separate from the jaws which indexes the leads for contacting and pushing the module into the socket holes of the printed circuit boards or into the contact springs of the header.

SUMMARY OF THE INVENTION

A tool for handling modules comprising a pair of opposing jaws movable toward and away from each other. The jaws are formed with opposing wall surfaces defining a recess for reception of and for clampingly holding the module. Each of the jaws have a plurality of aligned teeth forming pairs of spaced slots which communicate with the recess. The teeth are spaced so that they fit into spaces between pairs of the leads of the module and the leads project outwardly from the jaws through the slots. The tool further has an insertion assembly comprising a driving section and a component engaging section. The engaging section is disposed between the jaws and on the side of the module opposite the teeth. In this manner, when the driving section is depressed, the engaging section forces the module against the teeth thereby opening the jaws and inserting the module leads into the circuit board or multiple contact block.

BRIEF DESCRIPTION OF THE DRAWINGS

Referring now to FIGS. 1–5, there is shown a tool 10 which is generally in the form of a plier having a pair of handles 11, 11 which are pivotally connected together at a solid cylindrical pivot 12. Tool 10 includes a pair of opposing jaws 13, 13 which snuggly and clampingly hold circuit components such as an IC module or dual in-line module 14 shown in FIG. 3.

Figures 1, 2, 3, 4, 5:
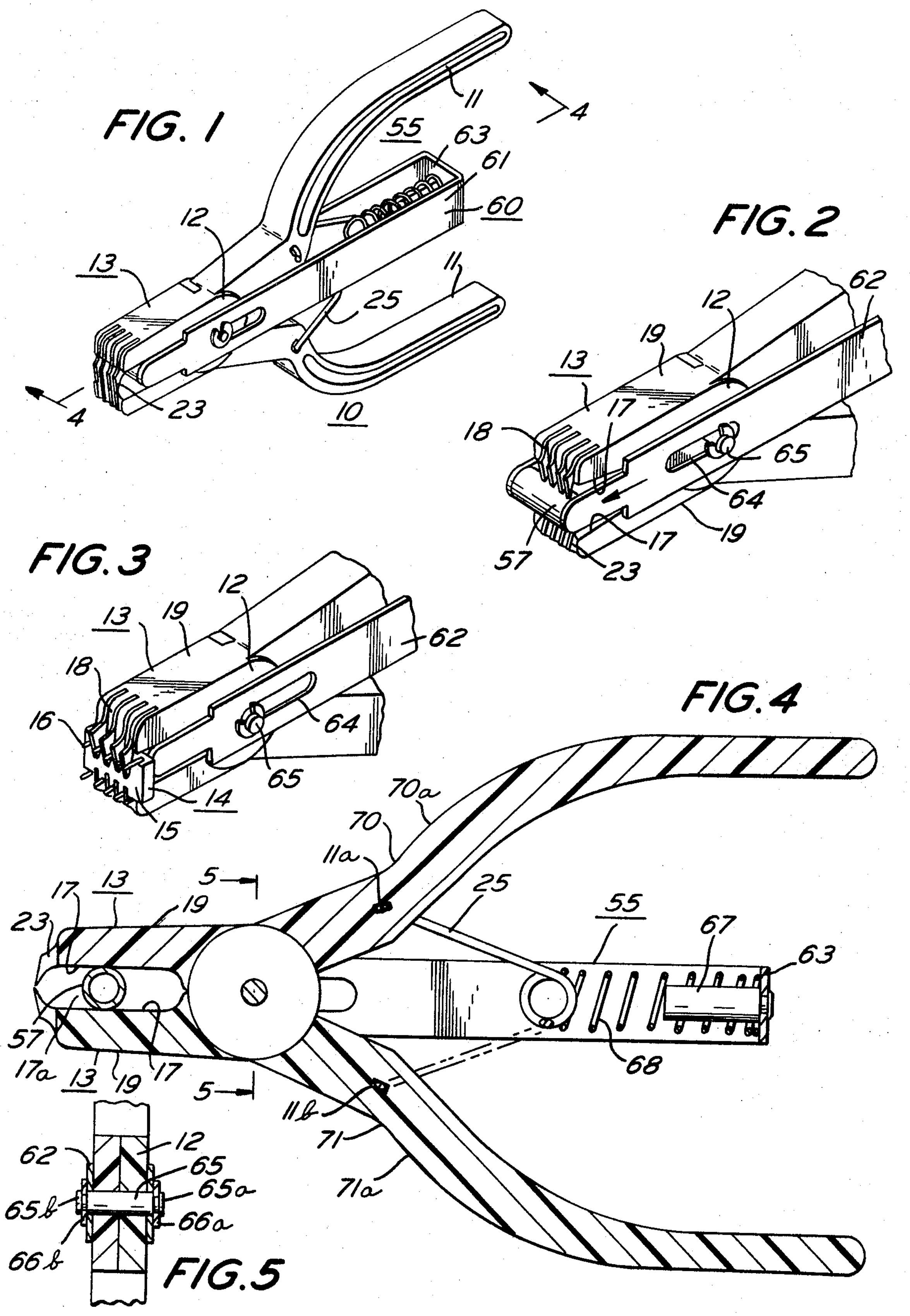
FIG. 1 is a perspective view of a tool embodying the present invention.
FIG. 2 is a perspective view of a portion of the tool of FIG. 1 in which the insertion assembly is in its extreme inserting position.
FIG. 3 is a perspective view of a portion of the tool of FIG. 1 showing the module being clampingly held.
FIG. 4 is a side view of the tool taken along lines 4—4 of FIG. 1.
FIG. 5 is a front view of the tool taken along lines 5—5 of FIG. 4.

In order to maintain a biasing force urging jaws 13 together and to clampingly hold module 14, there is disposed between the handles, a spring 25 having long legs. Each of the legs is bent at an end thereof and inserted within respective openings **11*a–b* of handles 11, 11.** A slight additional bend maintains the spring ends within the respective opening.

Module 14 comprises an elongated body portion 15 and spaced pairs of transverse leads 16 which are adapted to be inserted into socket holes in printed circuit boards or into contact spring elements of multiple connector blocks or headers (not shown).

Jaws 13 have a pair of opposing recess walls 17, 17 which form a space or recess **17*a* for receiving module body 15 when jaws 13, 13 are in their module-clamping (closed) position shown in FIG. 3. Specifically, recess walls 17, 17 form opposing flat parallel walls which engage the sides of module body 15. Without a module being held, as shown in FIGS. 1 and 4, walls 17 press against and are stopped by section 57 and jaws 13, 13** are in their fully closed position.

Jaws 13, 13 have flat outer walls 19, 19 which are substantially parallel to recess walls 17, 17 with the recess walls being substantially parallel to each other in both the fully closed and module-clamping positions. In addition, each of the jaws 13 is formed with aligned parallel slots or notches 18 which extend at substantially right angles to their respective walls 17, 19. These slots 18 are parallel to each other and communicate with recess 17a and separate jaws 13, 13 into a plurality of aligned substantially parallel teeth 23. As shown, teeth 23 are rigidly secured to each of jaws 13 and are in the form of spaced parallel plates which extend in each jaw from recess wall 17 almost to wall 19. Thus, as shown in FIG. 3, teeth 23 fit into spaces between pairs of leads 16 when module 14 is clampingly held by jaws 13, 13 and leads 16 project outwardly from the jaws through slots 18.

Teeth 23 on each of jaws 13, 13 extend in a direction away from the respective jaw and away from the opposing jaw. The teeth of each of the jaws extend toward the teeth of the opposing jaw to form an angle with those teeth. More particularly, each tooth 23 of each jaw forms in the area of recess **17*a*** an obtuse angle with its respective jaw.

Insertion assembly 55 comprises a component engaging section 57 rigidly secured to the driving section 60. Driving section 60 comprises a one piece U-shaped member 61 having a pair of elongated driving legs 62 and a central body section 61 adapted to be manually driven or depressed. A portion of member 61 is disposed between handles 11, 11. Engaging section 57 is disposed between and secured to the ends of legs 62 remote from driving section 63 by means of rivets, welding or the like. Driving legs 62 enclose and straddle a portion of pivot 12. As best shown in FIG. 5, a rod member 65 passes centrally through pivot 12 and has formed at ends thereof retainers or keepers **65*a–b*** which extend into elongated longitudinally extending slots 64, 64 formed in both legs 62. Fasteners **66*a–b* are secured to keepers 65*a–b***, as shown.

Spiral spring 68 has one end engaging the inner part of section 63 and surrounds a stop 67 secured to section 63. The other end of spring 68 rides on the coil of spring 25. In this manner, with assembly 55 not actuated or depressed, spring 68 urges assembly 55 and, thus, section 57 to their rearmost position, as illustrated in FIG. 3. This rearmost position is determined by keepers **65*a–b* engaging the forward ends of slots 64, 64 and in this position, there is sufficient room within recess 17*a* for housing module 14. The forwardmost position of assembly 55 is determined by stop 57, engaging spring 25. In this position, keepers 65*a–b* have not yet reached the rear ends of slots 64, 64**.

In the insertion operation, tool 10 is held in the hand of the operator and the handles are pulled together against spring bias in conventional manner to open jaws 13, 13. The tool is actuated to an open position sufficient to receive and pick up module 14. The handles are then released and module 14 is clampingly held in recess **17*a* by walls 17, 18 in the module-clamping position under the spring bias of spring 25. Tool 10 is then positioned with leads 16 indexed or aligned with the respective socket holes or contact springs. Tool 10 is then held with the thumb engaging driving section 63 and the forefinger and middle finger engaging an individual one of shoulders 70 and 71 formed in handles 11. Three other fingers may be used in different positions such as the forefinger engaging section 63 and the middle finger and thumb engaging shoulders 70 and 71** respectively.

Shoulders 70 and 71 are formed on outer surfaces of handles 11, 11 close to pivot 12. Each of the shoulders defines a handle surface extending away from the pivot rising transversely away from the longitudinal axis of tool 70. The rising portion is shown as surfaces **70*a* and 71*a***.

To insert module 14, section 63 is depressed which causes engaging section 57 to force module 14 against teeth 23. Since teeth 23 are at obtuse angles with their respective jaw, the module body 15 is effective to apply al component of force effective to open jaws 13, 13 against the force of spring 25. The fingers engaging shoulders 70 and 71 apply a force in a rearward direction against the upper part or rising portions **70*a*–71*a* of shoulders 70–71 which has a component of force acting to assist in the opening of jaws 13, 13**.

In the operation to remove a module from a circuit board or from a header, tool 10 in its fully closed position is grasped and the handles are pulled together thereby opening jaws 13, 13. Teeth 23 are then directed to slip in between the module body 15 and a circuit board or header. The teeth are effective to pull up the module, capturing it and then clampingly hold it in recess **17*a***.

As previously indicated, module 14 may have any number of pairs of leads 16 which are accommodated by tool 10. The reason for this is that each aligned pair of teeth 23 fit into the space between two adjacent pairs of leads 16 of a module along a substantial group of such pairs of leads. As a result of the construction of teeth 23 and jaws 13, 13, all of the leads 16 may be seen at one time thereby to provide ease in indexing of the module with the socket or contacts. In addition, tool 10 may accommodate modules having any number of pairs of leads.

What is claimed is:

1. A tool for handling modules each having an elongated body with spaced pairs of connector leads projecting from sides of the module, comprising a pair of opposing jaws movable toward and away from each other, said jaws being formed with opposing wall surfaces defining a recess for reception of and for clampingly holding said module, said jaws each having a plurality of spaced and aligned teeth forming a plurality of pairs of spaced aligned slots which communicate with said recess, said teeth being spaced so that the teeth fit into spaces between pairs of said leads of said module while said leads project outwardly from said jaws through said slots, and an insertion assembly comprising a driving section and a component engaging section, said engaging section being disposed between said jaws and on the side of said module opposite said teeth whereby when said driving section is depressed said engaging section forces said module against said teeth thereby opening said jaws and inserting said module into a receptacle.

2. The tool of claim 1 in which there is provided a pair of handles pivotally coupled to each other with each handle connected to a respectively one of said jaws, each of said handles having a shoulder formed on an outer surface thereof for receiving two fingers of an operator of said tool when a third finger depresses said driving section.

3. The tool of claim 2 in which said driving section comprises a U-shaped member a portion of which is disposed between said handles with a pair of driving legs straddling said pivotal coupling, and said pair of driving legs having secured at one end thereof said engaging section.

4. The tool of claim 3 in which there is provided means for biasing said insertion assembly to its rearmost position of said engaging section away from said teeth thereby to provide sufficient room within said recess to accommodate said module.

5. The tool of claim 4 in which there is provided spring means for biasing said jaws together and in which said teeth are formed in the shape of flat plates.

6. The tool of claim 5 in which each of said teeth extends in a direction away from its respective jaw and away from the opposing jaw and forms an obtuse angle with its respective jaw.

* * * * *